(12) United States Patent
Lee et al.

(10) Patent No.: US 12,170,308 B2
(45) Date of Patent: Dec. 17, 2024

(54) LIGHT EMITTING DISPLAY APPARATUS

(71) Applicant: LG DISPLAY CO., LTD., Seoul (KR)

(72) Inventors: Dongmyung Lee, Paju-si (KR);
Yonghoon Choi, Paju-si (KR);
Sookang Kim, Paju-si (KR); Jintae Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 430 days.

(21) Appl. No.: 17/545,336

(22) Filed: Dec. 8, 2021

(65) Prior Publication Data

US 2022/0199680 A1 Jun. 23, 2022

(30) Foreign Application Priority Data

Dec. 21, 2020 (KR) ........................ 10-2020-0179574

(51) Int. Cl.
*H01L 27/15* (2006.01)
*H01L 33/38* (2010.01)
*H01L 33/50* (2010.01)
*H01L 33/62* (2010.01)

(52) U.S. Cl.
CPC ............ *H01L 27/156* (2013.01); *H01L 33/38* (2013.01); *H01L 33/50* (2013.01); *H01L 33/62* (2013.01)

(58) Field of Classification Search
CPC ....... H01L 27/156; H01L 33/38; H01L 33/50; H01L 33/62; H10K 59/879; H10K 59/80515; H10K 59/80521; H10K 59/875; H10K 59/878; H10K 59/124; H10K 59/35; H10K 59/38
See application file for complete search history.

(56) References Cited

U.S. PATENT DOCUMENTS

| | | | |
|---|---|---|---|
| 2010/0181554 A1 | 7/2010 | Yoshida et al. | |
| 2017/0092705 A1 | 3/2017 | Lim et al. | |
| 2019/0393448 A1* | 12/2019 | Choi | H10K 50/856 |
| 2021/0333441 A1* | 10/2021 | Schwartz | G06V 10/147 |

OTHER PUBLICATIONS

Extended European Search Report dated May 16, 2022, issued in corresponding European Patent Application No. 21214434.9.

* cited by examiner

*Primary Examiner* — Mohammad A Rahman
(74) *Attorney, Agent, or Firm* — Morgan, Lewis & Bockius LLP

(57) ABSTRACT

A light emitting display apparatus includes a substrate including a plurality of pixels each including an emission area; a light extraction pattern including a plurality of concave portions in the emission area; and a light emitting portion over the light extraction pattern, wherein at least one of the plurality of concave portions has a curvature of 0.217 $\mu m^{-1}$ to 0.311 $\mu m^{-1}$.

16 Claims, 5 Drawing Sheets

LIGHT EMITTING DISPLAY APPARATUS

CROSS-REFERENCE TO RELATED APPLICATIONS

This application claims the benefit of the Korean Patent Application No. 10-2020-0179574 filed on Dec. 21, 2020, which is hereby incorporated by reference as if fully set forth herein.

BACKGROUND

Technical Field

The present disclosure relates to a light emitting display apparatus.

Discussion of the Related Art

Because a light emitting display device has a high response speed and low power consumption and spontaneously emits light without using a separate light source, unlike a liquid crystal display device, the light emitting display device less affected by limited viewing angle. Thus, the light emitting display device is attractive as a next-generation flat panel display device.

A light emitting display device displays an image by emitting light from light emitting elements, which have respective light emitting layers interposed between two electrodes. As such, light generated by the emission of light from the light emitting elements is externally discharged through the electrodes, a substrate, and other elements of the light emitting display device.

However, in such a light emitting display device, some of the light emitted from a light emitting layer is not externally discharged due to total reflection or the like at an interface between the light emitting layer and an electrode and/or an interface between the substrate and an air layer. As a result, light extraction efficiency decreases. Accordingly, a light emitting display device has a problem in that luminance decreases and power consumption increases due to low light extraction efficiency.

SUMMARY

Accordingly, embodiments of the present disclosure are directed to a display apparatus that substantially obviates one or more problems due to limitations and disadvantages of the related art.

An aspect of the present disclosure is to provide a light emitting display device that can enhance light extraction efficiency of light that is emitted from a light emitting portion.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display apparatus comprises a substrate including a plurality of pixels each including an emission area; a light extraction pattern including a plurality of concave portions in the emission area; and a light emitting portion over the light extraction pattern, wherein at least one of the plurality of concave portions has a curvature of 0.217 $\mu m^{-1}$ to 0.311 $\mu m^{-1}$.

In another aspect, a light emitting display apparatus comprises a substrate including a plurality of pixels each including an emission area; a planarization layer in the emission area including a light extraction pattern having a plurality of concave portions spaced apart from one another and a protruding portions on respective adjacent sides of each of the plurality of concave portions; a first electrode over the light extraction pattern; a light emitting device layer over the first electrode; and a second electrode over the light emitting device layer, wherein at least one of the plurality of concave portions has a curvature of 0.217 $\mu m^{-1}$ to 0.311 $\mu m^{-1}$.

In accordance with example arrangements with the light emitting display device according to the present disclosure, it is possible to enhance light extraction efficiency of light that is emitted from a light emitting portion, thereby improving luminance and decreasing power consumption.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Reference will now be made in detail to embodiments of the present disclosure, examples of which may be illustrated in the accompanying drawings. In the following description, when a detailed description of well-known functions or configurations related to this document may unnecessarily cloud a gist of the inventive concepts, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" encompasses the combination of all items proposed from two or more of the first item, the second item, and the third item as well as the first item, the second item, or the third item.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam pattern, this may be construed as the encapsulation layer at least partially surrounding the dam pattern. However, in some embodiments, the encapsulation layer may entirely surround the dam pattern. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, example embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

Figure 1:
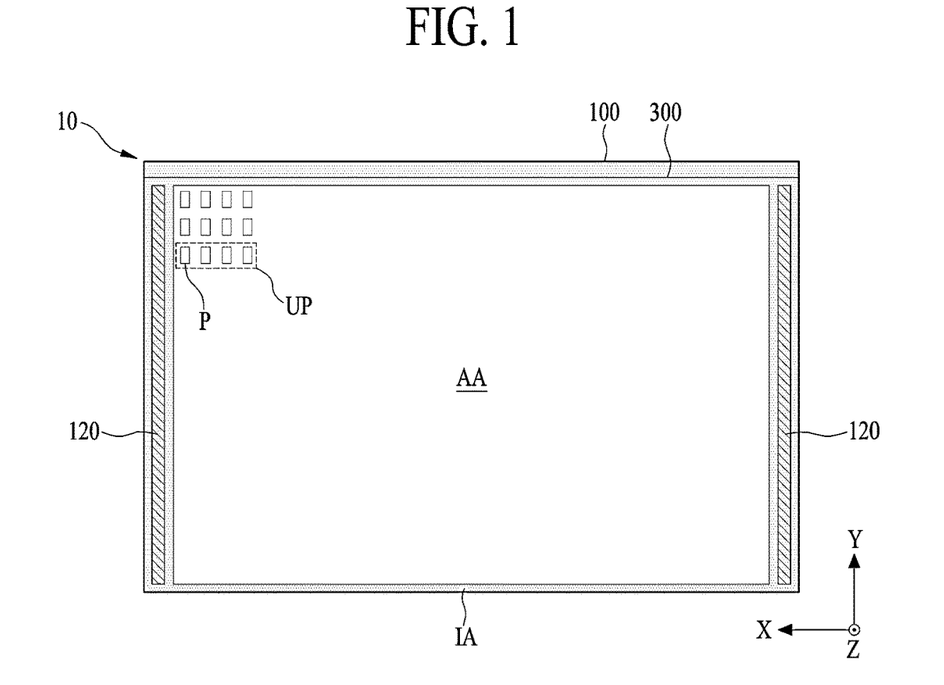
FIG. 1 is a diagram schematically illustrating a light emitting display device according to an example embodiment of the present disclosure.

FIG. 1 is a diagram schematically illustrating a light emitting display device according to an example embodiment of the present disclosure.

With reference to FIG. 1, a light emitting display device according to an example embodiment of the present disclosure may include a display panel 10 and a panel driving circuit part. The display panel 10 may include a substrate 100 and an opposite substrate 300 bonded to each other. The substrate 100 includes a thin film transistor, and the substrate 100 may be a first substrate, a lower substrate, a transparent glass substrate, or a transparent plastic substrate. The substrate 100 may include a display area AA and a non-display area IA.

The display area AA is an area for displaying an image. The display area AA may be a pixel array area, an active area, a display portion, or a screen. For example, the display area AA may be disposed at a central area of the display panel 10. The display area AA may include a plurality of pixels P.

Each of the plurality of pixels P may be a unit area in which light is actually emitted. According to an embodiment, among the plurality of pixels P, the three pixels which are disposed adjacently or disposed along a first direction X constitute a unit pixel. For example, the unit pixel UP may include at least one red pixel, at least one green pixel, and at least one blue pixel, but a unit pixel structure is not limited thereto. According to another embodiment, among the plurality of pixels P, the four pixels which are disposed adjacently or disposed along the first direction X constitute a unit pixel UP. The unit pixel may include at least one red pixel, at least one green pixel, at least one blue pixel, and at least one white pixel, but the unit pixel structure is not limited thereto. For example, each of the at least one red pixel, at least one green pixel, at least one blue pixel, and at least one white pixel may each be a subpixel.

Each of the plurality of pixels P may include a pixel circuit, and a light emitting portion connected with the pixel circuit. The light emitting portion may include a light emitting layer (or a light emitting device) interposed between a first electrode and a second electrode.

The non-display area IA is an area in which an image is not displayed. The non-display area IA may be a peripheral circuit area, a signal supply area, a non-active area, or a bezel area. The non-display area IA may surround the display area AA. The display panel 10 or substrate 100 may further include a peripheral circuit portion 120 disposed at the non-display area IA.

The peripheral circuit portion 120 may include a gate driving circuit connected to the plurality of pixels P. The gate driving circuit (or panel embedded gate driving circuit) may be integrated at one side or both sides of the non-display area IA of the substrate 100 according to a manufacturing process of a thin film transistor and may be connected to the plurality of pixels P. For example, the gate driving circuit may include a shift register already known in the art.

The opposite substrate 300 may encapsulate (or seal) the display area AA disposed at the substrate 100. For example, the opposite substrate 300 may be bonded to the substrate 100 by using an adhesive member (or transparent adhesive). The opposite substrate 300 may be an upper substrate, a second substrate, or an encapsulation substrate.

Additionally, the display panel 10 according to an example embodiment of the present disclosure may further include an optical film that is disposed to a light extraction surface from which light emitted from the pixel P is emitted among the first substrate 100 and the opposite substrate 300. For example, the optical film may further include a polarization film that is attached to a rear or lower surface (or the light extraction surface) of the substrate 100 or to a front or upper surface (or the light extraction surface) of the substrate 300.

Figure 2:
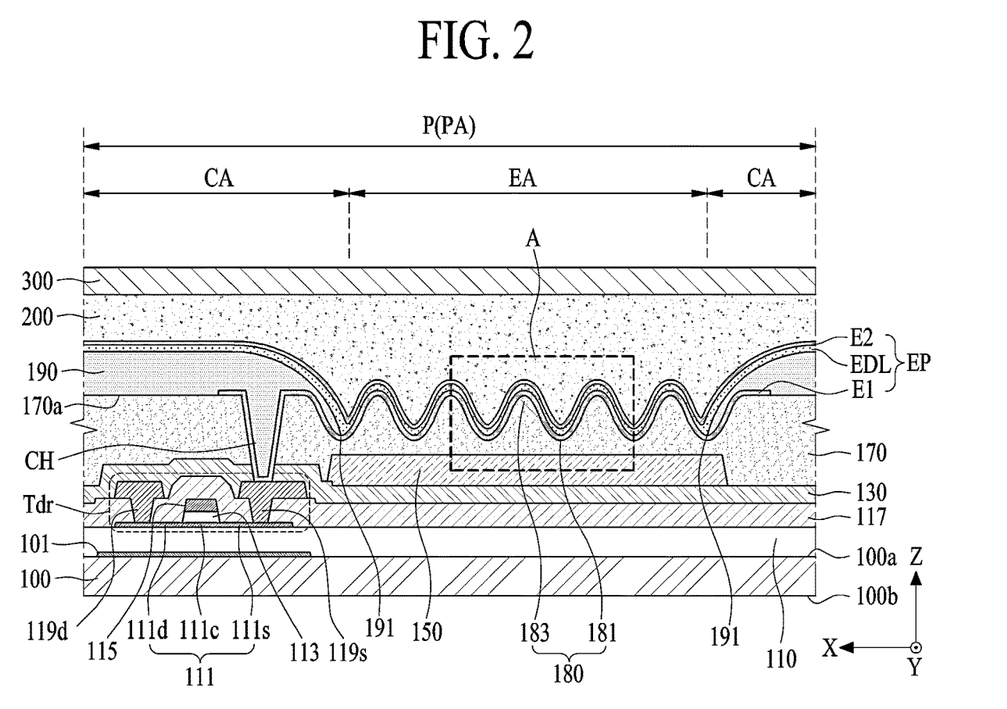
FIG. 2 is a sectional view illustrating one pixel illustrated in FIG. 1.
Figure 3:
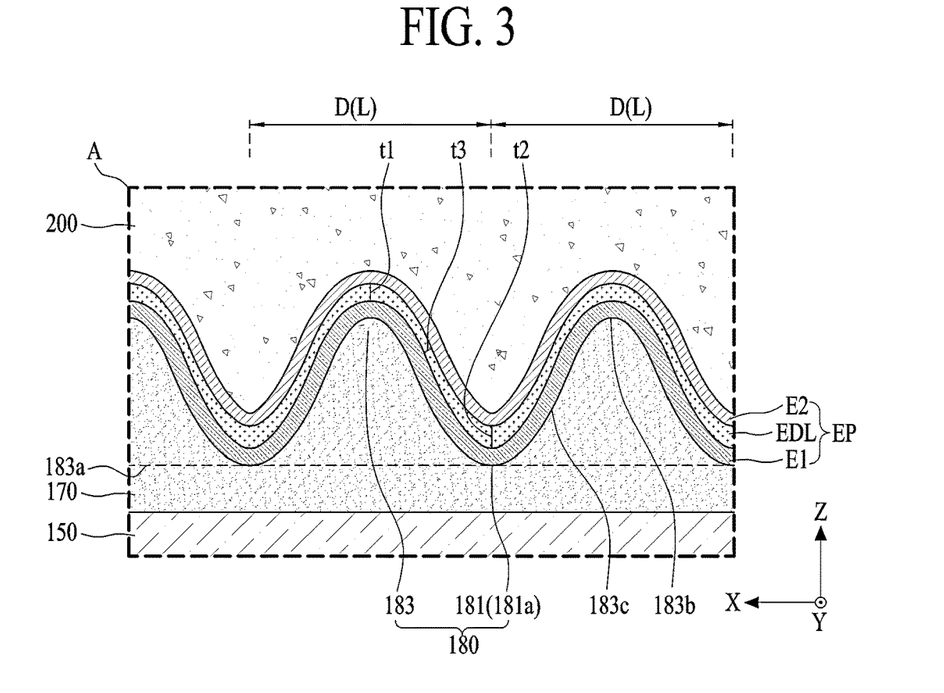
FIG. 3 is an enlarged view of portion 'A' illustrated in FIG. 2.

FIG. 2 is a sectional view illustrating one pixel illustrated in FIG. 1, and FIG. 3 is an enlarged view of portion 'A' illustrated in FIG. 2.

With reference to FIGS. 2 and 3, a pixel P according to an example embodiment of the present disclosure includes a pixel area PA and a circuit area CA.

The pixel area PA may include an emission area EA. The circuit area CA may be spatially separated from the emission area EA within the pixel P. The emission area EA may be defined as the remaining portions except for the circuit area CA in the pixel area PA. For example, the emission area EA may be an opening area or an opening portion. The circuit area CA may be a non-emission area, a non-opening area, or a non-opening portion.

The light emitting display device according to an example embodiment of the present disclosure may include a buffer layer 110, a pixel circuit portion, a protection layer 130, a planarization layer 170, and a light emitting portion EP over the substrate 100.

The buffer layer 110 may be disposed at an entire area of the first surface (or front surface) 100a of the substrate 100. The buffer layer 110 may prevent materials contained in the substrate 100 from spreading to a transistor layer during a high-temperature process in the manufacturing of the thin film transistor, or may prevent external water or moisture from permeating into the light emitting portion EP. Selectively, according to some embodiments of the present disclosure, the buffer layer 110 may be omitted.

The pixel circuit portion may include the driving thin film transistor Tdr disposed at the circuit area CA. The driving thin film transistor Tdr may include an active layer 111, a gate insulating film 113, a gate electrode 115, an insulating interlayer 117, a drain electrode 119d, and a source electrode 119s.

The active layer 111 included in the driving thin film transistor Tdr may be configured with a semiconductor material based on any one of amorphous silicon, polycrystalline silicon, oxide, and organic materials.

The gate insulating film 113 may be provided over a channel region 111c of the active layer 111. As an example, the gate insulating film 113 may be provided at an island shape only over the channel region 111c of the active layer 111, or may be provided over the entire surface of the buffer layer 110 or substrate 100 including the active layer 111.

The insulating interlayer 117 may be provided over the gate electrode 115, and a drain region 111d and a source region 111s of the active layer 111. The insulating interlayer 117 may be formed at the entire areas of the emission area EA and the circuit area CA. For example, the insulating interlayer 117 may be configured as an inorganic material or an organic material.

The pixel circuit portion may further include at least one capacitor and at least one switching thin film transistor disposed at the circuit area CA together with the driving thin film transistor Tdr.

The capacitor may be provided in an overlap area of the gate electrode 115 and the source electrode 119s of the driving thin film transistor Tdr with the insulating interlayer 117 interposed therebetween.

The at least one switching thin film transistor may be provided at the circuit area CA to have substantially the same structure as the driving thin film transistor Tdr, and thus, its repetitive descriptions may be omitted. The at least one switching thin film transistor may be switched (or driven) to initialize a voltage of the capacitor or store a data voltage in the capacitor.

Additionally, the pixel circuit portion may further include a light blocking layer 101 provided below (or under) the active layer 111 of at least one of the thin film transistors provided at the circuit area CA.

The light blocking layer 101 may be provided between the substrate 100 and the active layer 111 and may serve to reduce or prevent change in a threshold voltage of the transistor due to external light by blocking light which is incident at the active layer 111 via the substrate 100. The light blocking layer 101 may be covered (or overlaid or surrounded) by the buffer layer 110. Selectively, the light blocking layer 101 may be electrically connected to the source electrode of the transistor or electrically connected to a separate bias power source and may serve as a lower gate electrode of the corresponding thin film transistor. In this case, the light blocking layer 101 may minimize or prevent change in characteristics due to light or change in a threshold voltage of the transistor due to a bias voltage.

The protection layer 130 may be provided over the substrate 100 to cover (or overlay) the transistor layer including the thin film transistors. That is, the protection layer 130 covers (or overlays) the drain electrode 119d and the source electrode 119s of the driving thin film transistor Tdr and the insulating interlayer 117. For example, the protection layer 130 may be formed of an inorganic insulating material and may be referred to as a passivation layer. Selectively, the protection layer 130 may be omitted.

The planarization layer 170 may be provided over the substrate 100 to cover (or overlay) the protection layer 130. When the protection layer 130 is omitted, the planarization layer 170 may be provided over the substrate 100 to cover (or overlay) the pixel circuit portion. The planarization layer 170 may be provided over the entire areas of the circuit area CA and the emission area EA. Also, the planarization layer 170 may be provided over the entire display area AA and the remaining portions of the non-display area IA except a pad area.

The planarization layer 170 according to an example embodiment of the present disclosure is configured to have a relatively large thickness so that the planarization layer 170 may provide a planarized surface over the display area AA. For example, the planarization layer 170 may be formed of an organic material such as photo acrylic, benzocyclobutene, polyimide, fluorine resin, or the like, but is not limited thereto.

The planarization layer 170 may include the light extraction pattern 180 disposed at the pixel area PA. The light extraction pattern 180 may be provided at an upper surface 170a of the planarization layer 170 to overlap with the emission area EA of the pixel area PA. The light extraction pattern 180 is provided at the planarization layer 170 of the emission area EA to have a curved (or rippled or corrugated or undulated or uneven) shape, whereby a progress path of light emitted from the light emitting portion EP is changed to increase light extraction efficiency of the pixel P. The light extraction pattern 180 may be formed or implemented with a lens shape having a convex surface and a concave surface. Here, the convex surface and a concave surface may be a plurality of curved concave surfaces respectively alternated with curved concave surfaces to define a curved wave shape surface. Other surface shapes may be utilized as well. In the convex-concave surfaces, the concave surface portions form depressions as viewed from the light emitting surface, and the convex surface portions form protruding portions as viewed from the light emitting surface. For example, the light extraction pattern 180 may be referred to as a non-planar portion, an optical path control portion, a microlens portion, a microlens array, or a light scattering pattern.

The light extraction pattern 180 according to an example embodiment may include a plurality of concave portions 181 and a protruding portion 183 between the plurality of concave portions 181.

Each of the plurality of concave portions (or depressions) 181 may be concavely formed or implemented from the upper surface (or the flat surface) 170a of the planarization layer 170 by a patterning process of the planarization layer 170. For example, the lower surface 181a of the plurality of concave portions 181 may be positioned between the upper surface 170a of the planarization layer 170 and the substrate 100.

Each of the plurality of concave portions 181 may be configured to have the same depth with respect to an upper surface 170a of the planarization layer 170, but is not limited thereto. For example, some of the plurality of concave portions 181 may have different depths within an error or tolerance range for a patterning process of the light extraction pattern 180.

The convex portions (or protruding portions) 183 may be formed to be connected to each other between the plurality of concave portions 181. The protruding portion 183 may be formed to surround each of the plurality of concave portions 181. Thus, the protruding portion 183 may be formed or implemented to have a shape that may maximize or increase external extraction efficiency of light that is emitted from the light emitting portion EP. Therefore, the protruding portion 183 change a propagation path of light emitted from the light emitting portion EP toward the light extraction surface (or the light output surface) to enhance the external extraction efficiency of light emitted from the light emitting portion EP.

For example, the protruding portion 183 may reduce, prevent, or minimize a decrease in light extraction efficiency due to light trapped in the light emitting portion EP by repeating total reflection in the light emitting portion EP without traveling to the light extraction surface.

According to an example embodiment of the present disclosure, a formation area (or an arrangement area) of the light extraction pattern 180 within one pixel P may be greater than the emission area EA. For example, when the formation area (or the arrangement area) of the light extraction pattern 180 is smaller than the emission area EA, light generated at the edge of the emission area EA may travel to other adjacent pixels, thereby occurring color mixing between adjacent pixels P.

The light extraction pattern 180 including the plurality of concave portions 181 and the protruding portion 183 may be formed through a patterning process of the planarization layer 170 using a mask pattern after the mask pattern is formed over the planarization layer 170 of the emission area EA through a photolithography process using a photoresist. For example, a positive photoresist may be used as the photoresist to improve productivity.

The light emitting portion EP may be disposed over the light extraction pattern 180 of the emission area EA and may emit the light toward the substrate 100 according to a bottom emission type, but is not limited thereto. The light emitting portion EP according to an example embodiment may include a first electrode E1, a light emitting device layer EDL, and a second electrode E2.

The first electrode (or an anode) E1 may be provided over the planarization layer 170 of the pixel area PA and may be electrically connected to the source electrode 119s of the driving thin film transistor Tdr. One end of the first electrode E1 which is close to the circuit area CA extends onto the source electrode 119s of the driving thin film transistor Tdr, and then may be electrically connected to the source electrode 119s of the driving thin film transistor via an electrode contact hole CH prepared at the planarization layer 170 and the protection layer 130.

The first electrode E1 may directly contact the light extraction pattern 180, whereby the first electrode E1 may have a shape corresponding to the light extraction pattern 180. If the first electrode E1 is provided (or deposited) over the planarization layer 170, and is configured to have a relatively small thickness, the first electrode E1 may have a surface morphology (or second surface shape) which conforms to a surface morphology (or first surface shape) of the light extraction pattern 180 including the plurality of concave portions 181 and the protruding portion 183. For example, the first electrode E1 may be formed in a conformal shape based on the surface shape (morphology) of the light extraction pattern 180 by a deposition process of a transparent conductive material, whereby the first electrode E1 may have a cross-sectional structure whose shape may be the same as the light extraction pattern 180.

The first electrode E1 according to an example embodiment may include a transparent conductive material, such as transparent conductive oxide (TCO) such that light emitted from the light emitting device layer EDL is transmitted to the substrate 100. For example, the first electrode E1 may be formed of indium tin oxide (ITO) or indium zinc oxide (IZO). For example, the first electrode E1 may be referred to as an anode, an anode electrode, a pixel electrode, a transparent electrode, a transparent pattern electrode, or the like.

The light emitting device layer EDL may provided over the first electrode E1 and may directly contact the first electrode E1. As the light emitting device layer EDL is provided (or deposited) over the first electrode E1, and is configured to have a relatively large thickness in comparison to the first electrode E1, the light emitting device device layer EDL may have a surface morphology (or third surface shape) which is different from the surface morphology in each of the plurality of concave portions 181 and the protruding portion 183 or the surface morphology of the first electrode E1. For example, the light emitting layer EDL may be formed in a non-conformal shape which does not conform to the surface shape (or morphology) of the first electrode E1 by a deposition process, whereby the light emitting device layer EDL may have a cross-sectional structure whose shape may be different from that of the first electrode E1.

The light emitting device layer EDL according to an example embodiment of the present disclosure may have a thickness gradually thicker toward the bottom surface 181a of the concave portion 181. For example, the light emitting device layer EDL may be formed of a first thickness t1 over the protruding portion 183, may be formed of a second thickness t2 thicker than the first thickness t1 over the bottom surface 181a of the concave portion 181, and may be formed over an inclined portion between a top portion of the protruding portion 183 and the bottom surface 181a of the concave portion 181 to have a third thickness t3 smaller than the first thickness t1. Herein, each of the first, second, and third thicknesses t1, t2, and t3 may correspond to the shortest distance between the first electrode E1 and the second electrode E2.

The light emitting device layer EDL according to an example embodiment of the present disclosure includes two or more light emitting layers for emitting white light. As an example, the light emitting device layer EDL may include a first light emitting layer and a second light emitting layer to emit white light by mixing a first light and a second light. For example, the first light emitting layer may include any one selected of a blue light emitting layer, a green light emitting layer, a red light emitting layer, a yellow light emitting layer, and a yellow-green light emitting layer to emit the first light. For example, the second light emitting layer may include a light emitting layer capable of emitting the second light to obtain white light in the light emitting device layer EDL by mixing the first light of a blue light emitting layer, a green light emitting layer, a red light emitting layer, a yellow light emitting layer, or a yellow-green light emitting layer. The light emitting device layer EDL according to another embodiment may include any one selected of a blue light emitting layer, a green light emitting layer, and a red light emitting layer.

The light emitting device layer EDL according to another example embodiment of the present disclosure may include at least one light emitting layer to emit blue light.

The second electrode E2 may be provided over the light emitting device layer EDL and directly contact the light emitting device layer EDL. The second electrode E2 may be formed (or deposited) at the light emitting device layer EDL to have a relatively small thickness than the light emitting device layer EDL. The second electrode E2 may be formed (or deposited) at the light emitting device layer EDL to have a relatively small thickness, and thus may have a surface morphology corresponding to the surface morphology of the light emitting device layer EDL. For example, the second electrode E2 may be formed in a conformal shape corresponding to the surface shape (or morphology) of the light emitting device layer EDL by a deposition process, whereby the second electrode E2 may have the same cross-sectional structure as the light emitting device layer EDL.

The second electrode E2 according to an example embodiment may include a metal material having a high reflectance to reflect the incident light emitted from the light emitting device layer EDL toward the substrate 100. The second electrode E2 may include an opaque conductive material having high reflectance. For example, the second electrode E2 may include a single-layered structure or multi-layered structure of any one material selected from aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba). For example, the second electrode E2 may be referred to as a cathode, a cathode electrode, a common electrode, a reflective electrode, or the like.

The light emitting display device according to an example embodiment of the present disclosure may further include a wavelength conversion layer 150.

The wavelength conversion layer 150 may be disposed between the substrate 100 and the planarization layer 170 to overlap with at least one emission area EA. The wavelength conversion layer 150 according to an example embodiment may be disposed between the protection layer 130 and the planarization layer 170 to overlap with the emission area EA. The wavelength conversion layer 150 according to another example embodiment may be disposed between the substrate 100 and the insulating interlayer 117 or between insulating interlayer 117 and the protection layer 130 to overlap with the emission area EA.

The wavelength conversion layer 150 may have a larger size, i.e. surface area than the emission area EA. For example, the wavelength conversion layer 150 may be larger than the emission area EA, and/or may be smaller than the light extraction pattern 180 of the planarization layer 170, but is not limited thereto, and the wavelength conversion layer 150 may be larger than the light extraction pattern 180 of the planarization layer 170. For example, the wavelength conversion layer 150 may have a size corresponding to the whole pixel area PA of each pixel P.

The wavelength conversion layer 150 according to an example embodiment may include a color filter which transmits only the wavelength corresponding to a color in the pixel of the light emitted (or extracted) from the light emitting portion EP toward the substrate 100. For example, the wavelength conversion layer 150 may transmit only the red wavelength, green wavelength, or blue wavelength. When one unit pixel comprises adjacent first to fourth pixels P, the wavelength conversion layer provided at the first pixel may include a red color filter, the wavelength conversion layer provided at the second pixel may include a green color filter, and the wavelength conversion layer provided at the third pixel may include a blue color filter. The fourth pixel may not include a wavelength conversion layer or may include a transparent material to compensate a step difference between adjacent pixels, thereby emitting white light.

The wavelength conversion layer 150 according to another embodiment may include a quantum dot to emit light of a color set in the pixel P corresponding to the blue light emitted from the light emitting portion EP toward the substrate 100. Optionally, the wavelength conversion layer 150 according to another embodiment may be implemented with a sheet (or a film) including a quantum dot layer disposed overlapped with the emission area EA of the plurality of pixels P and may be attached to the light extraction surface.

The light emitting display device according to an example embodiment of the present disclosure may further include a bank layer 190 and an encapsulation layer 200.

The bank layer 190 (or bank pattern) may define the emission area EA within the pixel area PA, and may be disposed at the planarization layer 170 and an edge of the first electrode E1. The bank layer 190 may be overlapped with the edge of the wavelength conversion layer 150. The bank layer 190 may be formed of an organic material such as benzocyclobutene (BCB)-based resin, acrylic-based resin, polyimide resin, or the like. For example, the bank layer 190 may be formed of a photosensitizer including a black pigment. In this case, the bank layer 190 may also function as a light shielding member between the adjacent pixels.

The bank layer 190 according to an example embodiment may be disposed over the upper surface 170a of the planarization layer 170 to cover (or overlay) the edge of the first electrode E1 extending onto the circuit area CA of the pixel area PA and may be disposed to cover (or overlay) the edge of the light extraction pattern 180. The emission area EA defined by the bank layer 190 may be smaller in size than the light extraction pattern 180 of the planarization layer 170 in a two-dimensional structure. For example, the upper surface 170a of the planarization layer 170 in direct contact with the bank layer 190 may be referred to as a flat surface, a flat portion, or the like. The flat surface 170a of the planarization layer 170 may surround the light extraction pattern 180 disposed in each pixel P.

The light emitting device layer EDL may be provided over the first electrode E1, the bank layer 190, and a step difference portion between the first electrode E1 and the bank layer 190. When the emitting device layer EDL is provided with a small thickness at the step difference portion between the first electrode E1 and the bank layer 190, an electrical contact (or short) may occur between the second electrode E2 and the first electrode E1 due to a thickness reduction of the emitting device layer EDL. To prevent this problem, one end 191 of the bank layer 190 may be disposed to be covered (or overlaid) the edge of the light extraction pattern 180 to reduce a step difference between the first electrode E1 and the bank layer 190, thereby preventing the electric contact (or short) between the anode electrode E1 and the cathode electrode E2. For example, one end 191 of the bank layer 190 may be disposed between the upper surface 170a of the planarization layer 170 and the bottom surface of the outermost concave portion 181 of the light extraction pattern 180.

Each of the light emitting device layer EDL and the second electrode E2 of the light emitting portion EP may be further provided over the bank layer 190. That is, the light emitting portion EP may be disposed to cover (or overlay) the first electrode E1 and the bank layer 190, and the second electrode E2 may be formed to cover (or overlay) the light emitting device layer EDL.

The encapsulation layer 200 may be formed over substrate 100 to cover (or overlay) the second electrode E2. For example, the encapsulation layer 200 may be disposed between the substrate 100 and the opposite substrate 300 and may surround the display area. The encapsulation layer 200 may protect the thin film transistor and the light emitting portion EP from external impact and prevent oxygen or/and water and particles from being permeated into the light emitting portion EP.

The encapsulation layer 200 according to an example embodiment may include a plurality of inorganic encapsulation layer. The encapsulation layer 200 may further include at least one organic encapsulation layer interposed between the plurality of inorganic encapsulation layer.

The encapsulation layer 200 according to another example embodiment may further include a filler completely surrounding the display area. In this case, the opposite substrate 300 may be bonded to the substrate 100 by using the filler.

Figure 4:
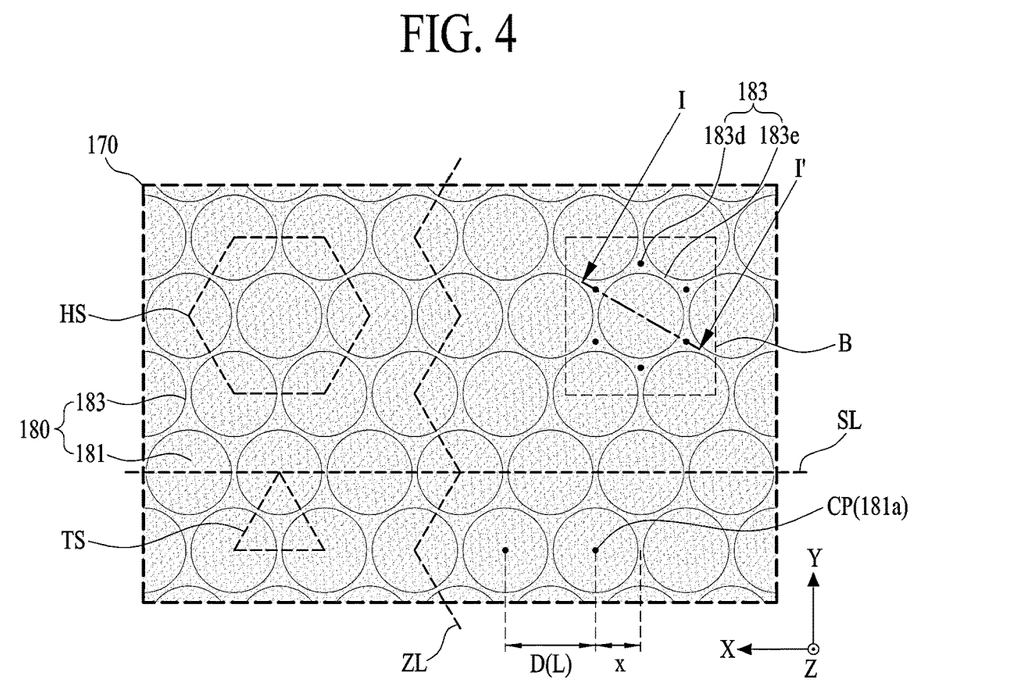
FIG. 4 is a plan view illustrating a light extraction pattern illustrated in FIG. 2.
Figure 5:
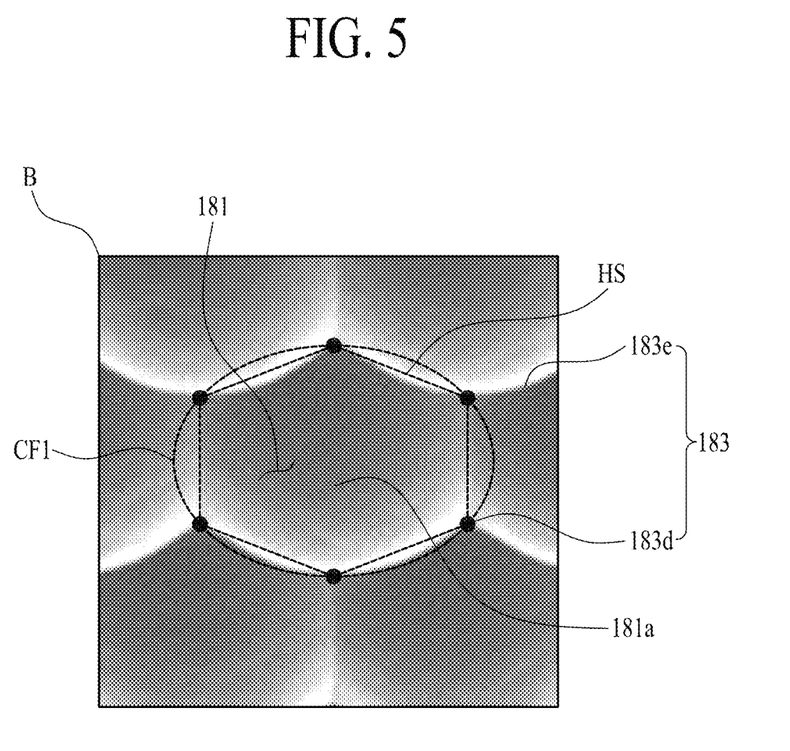
FIG. 5 is an enlarged view of portion 'B' illustrated in FIG. 4.

FIG. 4 is a plan view illustrating a light extraction pattern illustrated in FIG. 2, and FIG. 5 is an enlarged view of portion 'B' illustrated in FIG. 4.

With reference to FIGS. 3 to 5, the light extraction pattern 180 according to the present disclosure may include a plurality of concave portions 181 and a protruding portion 183.

Each of the plurality of concave portions 181 according to the present disclosure may be arranged in parallel to have a predetermined interval along a first direction X, and may be alternately arranged along a second direction Y crossing the first direction X. As an example, the central portion of each of the plurality of concave portions 181 disposed along the first direction X may be positioned or aligned in a straight line SL parallel to the first direction X. And, the central portion of each of the plurality of concave portions 181 disposed along the second direction Y may be positioned or aligned in a zigzag line ZL having a zigzag shape along the second direction Y. As another embodiment, each of the plurality of concave portions 181 disposed in the even-numbered horizontal line parallel to the first direction X may be disposed between the plurality of concave portions 181 disposed at an adjacent odd-numbered horizontal line along the second direction Y. Thus, the light extraction pattern 180 may include a larger number of concave portions 181 per unit area, thereby increasing the external extraction efficiency of the light emitted from the light emitting portion EP.

According to an example embodiment, the central portion of each of the adjacent three concave portions 181 may form a triangular shape (TS). In addition, the central portion of each of the six concave portions 181 disposed around one concave portion 181 or surrounding one concave portion 181 may have a 6-angular shape (HS). For example, each of the plurality of concave portions 181 may be arranged or arranged in a honeycomb structure or a circle structure.

According to an example embodiment of the present disclosure, the pitch (or interval) D between the concave portions 181 disposed in each of the plurality of pixels P configuring one unit pixel may be the same or different. Herein, the pitch between the concave portions 181 may be an interval (or distance) between the center portions of the two adjacent concave portions 181. As an example, the pitch D between the concave portions 181 disposed in each of the red, green, and blue pixels configuring one unit pixel may be the same or different. For example, the pitch D between the concave portions 181 disposed in the green pixel may be different from the pitch between the concave portions 181 disposed in the blue pixel. As another example, the pitch D between the concave portions 181 disposed in each of the red, green, blue and white pixels configuring one unit pixel may be the same or different. For example, the pitch D between the concave portions 181 disposed in each of the white pixel and/or the green pixel may be different from the pitch D between the concave portions 181 disposed in the red pixel and/or the blue pixel.

The pitch (or interval) D between the two adjacent concave portions 181 according to an example embodiment of the present disclosure may have a range of 4.2 μm to 4.9 μm (4.2 μm≤D≤4.9 μm), but is not limited thereto. For example, the pitch (or interval) D between the two adjacent concave portions 181 may have a range of 4.2 μm to 4.8 μm (4.2 μm≤D≤4.8 μm), but is not limited thereto.

The protruding portion 183 may be provided in the planarization layer 170 overlapping the emission area EA to have a shape for maximizing the external extraction efficiency of light emitted from the pixel P based on an effective emission area of the light emitting portion EP. The protruding portion 183 may change a traveling path of light, emitted from the light emitting portion EP, to a path toward the substrate 100 and may irradiate light, totally reflected in the light emitting portion EP, onto the substrate 100, thereby reducing, preventing, or minimizing a reduction in the light extraction efficiency of light trapped in the light emitting portion EP.

The protruding portion 183 may be implemented to individually surround each of the plurality of concave portions 181. Therefore, the planarization layer 170 overlapping the emission area EA may include the plurality of concave portions 181 surrounded by the protruding portion 183. The protruding portion 183 surrounding one concave portion 181 may one-dimensionally have a hexagonal shape (or honeycomb shape).

The protruding portion 183 according to an example embodiment of the present disclosure may include a bottom portion (or a bottom surface) 183a, a top portion (or a top surface) 183b over the bottom portion 183a, and an inclined portion 183c between the bottom portion 183a and the top portion 183b.

The bottom portion 183a of the protruding portion 183 may be a bottom surface 181a of the concave portion 181. For example, the bottom portion 183a of the protruding portion 183 and the bottom surface 181a of the concave portion 181 may be disposed on the same plane.

The top portion 183b of the protruding portion 183 may be disposed on the same plane as the top surface 170a of the planarization layer 170, or may be disposed between the top surface 170a of the planarization layer 170 and the substrate 100. For example, a distance between the top portion 183b of the protruding portion 183 and the substrate 100 may be less than or equal to a distance between the top surface 170a of the planarization layer 170 and the substrate 100.

The top portion 183b of the protruding portion 183 may have a convex curved shape. For example, the top portion 183b of the protruding portion 183 may include a dome or bell structure having a convex cross-sectional shape, but is not limited thereto.

The inclined portion 183c of the protruding portion 183 may have a curved shape between the bottom portion and the top portion. The inclined portion 183c of the protruding portion 183 may form or implement the concave portion 181. For example, the inclined portion 183c of the protruding portion 183 may be an inclined surface or a curved portion.

The inclined portion 183c of the protruding portion 183 according to an example embodiment of the present disclosure may have a cross-sectional structure having a Gaussian curve. In this case, the inclined portion 183c of the protruding portion 183 may have a tangent slope which increases progressively from a bottom portion to a top portion and then decreases progressively. Here, the tangent slope may be defined as an angle between an inclined portion and a horizontal line parallel to the bottom surface of the protruding portion 183. According to an example embodiment of the present disclosure, a maximum tangent slope of the inclined portion 183c may be provided in a half-height region of each of the protruding portions 183, or may be provided between the half-height region and a top portion. Therefore, the inclined portion 183c of the protruding portion 183 may include an inflection point which is provided in the half-height region, or is provided between the half-height region and a top portion. For example, the tangent slope of the inclined portion 183c may increase progressively from a bottom portion to the inflection point and then may decrease progressively from the inflection point to the top portion.

The protruding portion 183 according to an example embodiment of the present disclosure may further include a plurality of peak portions 183d and a plurality of ridge portions 183e.

Each of the plurality of peak portions 183d may be disposed between three adjacent concave portions 181. Each of the plurality of peak portions 183d may be a center portion between three adjacent concave portions 181. Each of the plurality of peak portions 183d may be a portion at which top portions of the protruding portion 183 surrounding each of three adjacent concave portions 181 contact each other. For example, each of the plurality of peak portions 183d may be a highest portion in the light extraction pattern 180. Therefore, each of the plurality of peak portions 183d may be referred to as a highest portion, a peak portion, a triple portion, a multipoint, or a triple point.

Each of the plurality of ridge portions 183e may be disposed or connected between two adjacent peak portions 183d, between two adjacent concave portions 181. Each of the plurality of ridge portions 183e may be a top portion of the protruding portion 183 disposed between two adjacent peak portions 183d. Therefore, each of the plurality of peak portions 183d may be a portion at which three adjacent ridge portions 183e are connected to one another. Peak portions 183d and six ridge portions 183e near the concave portion 181 may one-dimensionally form a hexagonal shape HS. For example, each of the plurality of ridge portions 183e may be referred to as a connection portion or a peak connection portion.

Each of the plurality of ridge portions 183e may have a concave curved shape between two adjacent peak portions 183d. For example, each of the plurality of ridge portions 183e may have a tangent slope which increases progressively from a center portion (or a bottom portion of a ridge portion) between two adjacent peak portions 183d to two adjacent peak portions 183d and then decreases progressively.

As described above, in the light emitting display apparatus according to an example embodiment of the present disclosure, a path of light emitted from the light emitting portion EP may be changed by the light extraction pattern 180 including the protruding portion 183 and the concave portions 181 provided in the emission area EA of a pixel, and thus, light extraction efficiency may be enhanced, thereby enhancing luminance and reducing power consumption.

In the light emitting display apparatus according to an example embodiment of the present disclosure, the concave portions 181 of the light extraction pattern 180 may have a certain curvature based on a shape of the protruding portion 183, and a curvature of each of the concave portions 181 may affect the light extraction efficiency of a pixel where light emitted from the light emitting portion EP is extracted to the outside. For example, the light extraction efficiency of a pixel may be affected by a tangent slope of an inclined portion of the protruding portion 183. The curvature of each of the concave portions 181 may correspond to the inclined portion of the protruding portion 183, and thus, the tangent slope of the inclined portion may affect the curvature of each of the concave portions 181. Accordingly, the curvature of each of the concave portions 181 disposed in the light extraction pattern 180 may be a factor for determining the emission efficiency, light extraction efficiency, and current efficiency increase rate of a pixel (or a light emitting display apparatus).

Figure 6:
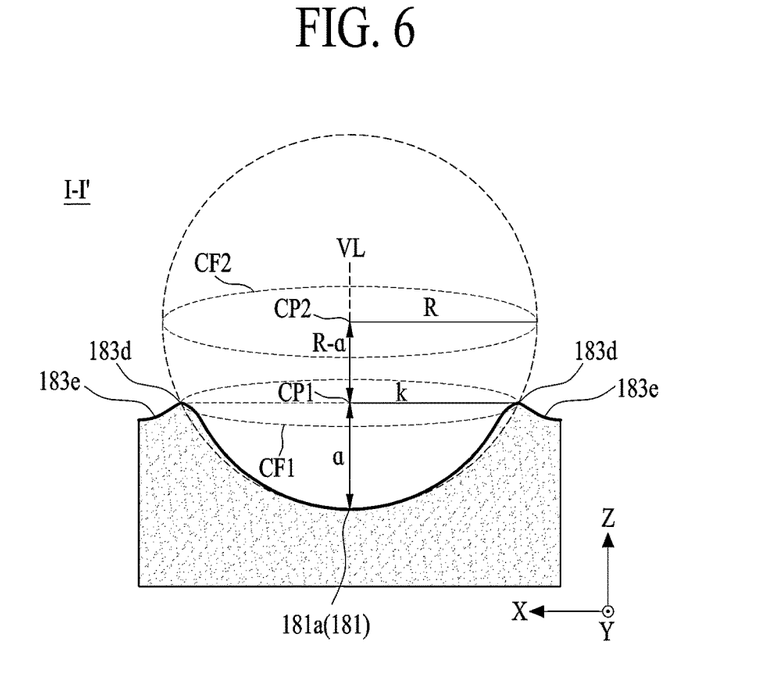
FIG. 6 is a cross-sectional view taken along line I-I' illustrated in FIG. 4.

FIG. 6 is a cross-sectional view taken along line I-I' illustrated in FIG. 4 and is a diagram for describing a curvature of a concave portion according to an example embodiment of the present disclosure.

With reference to FIGS. 4 to 6, in a light extraction pattern 180 according to an example embodiment of the present disclosure, each of a plurality of concave portions 181 may be formed or implemented by an inclined portion, having a curved shape, of a protruding portion 183, and thus, may have a spherical shape. Each of the plurality of concave portions 181 may correspond to a spherical shape having a radius which is greater than a half pitch (D/2) between two adjacent concave portions 181. For example, each of the plurality of concave portions 181 may have a spherical shape which is less than a hemisphere, but is not limited thereto.

Each of a plurality of concave portions 181 may be surrounded by six peak portions 183d. For example, six peak portions 183d may be disposed near one concave portion 181. In the following description, six peak portions 183d which surround one concave portion 181 or are disposed near one concave portion 181 may be referred to as "peak portions 183d near a concave portion 181."

Peak portions 183d near a concave portion 181 may one-dimensionally form a circular shape, but may be disposed in a first circle track (or a first circumference) CF1. The first circle track CF1 may have a circular shape passing through the peak portions 183d near the concave portion 181. For example, the first circle track CF1 may have a circular shape which passes through an origin point corresponding to a center portion CP1 between the peak portions 183d near the concave portion 181 and has a radius corresponding to a distance between the concave portion 181 and the peak portion 183d. The center portion CP1 of the first circle track CF1 may be disposed or aligned at a center portion of the concave portion 181.

According to an example embodiment of the present disclosure, in the protruding portion 183, the first circle track CF1 passing through the peak portions 183d near the concave portion 181 may contact a second circle track CF2 having a spherical shape corresponding to the concave portion 181, or may an inscribed circle having a spherical shape corresponding to the concave portion 181. For example, the second circle track CF2 may have a circular shape that passes through an origin point corresponding to a center portion of each of the peak portions 183d near the concave portion 181 and has a radius 'R' which is greater than the first circle track CF1. Accordingly, each of a center portion of a bottom surface 181a of the concave portion 181, a center portion CP1 of the first circle track CF1, and a center portion CP2 of the second circle track CF2 may be disposed or aligned in a vertical line VL parallel to a thickness direction Z of a substrate.

The center portion CP1 of the first circle track CF1 may be disposed under the center portion CP2 of the second circle track CF2. The center portion CP1 of the first circle track CF1 may be spaced apart from a center portion of the bottom surface 181a of the concave portion 181 by a first distance 'a' and may be spaced apart from the center portion CP2 of the second circle track CF2 by a second distance 'R-α'. According to an example embodiment of the present disclosure, when a pitch 'D' between two adjacent concave portions 181 is 4.2 µm to 4.8 µm, the first distance 'α' may have a range of 0.925 µm to 1.104 µm (0.925 µm≤α≤1.104 µm). The second distance 'R-α' may have a value obtained by subtracting the first distance 'α' from the radius 'R' of the second circle track CF2.

The plurality of concave portions 181 according to an example embodiment of the present disclosure may each have a certain curvature based on a spherical shape, but is not limited thereto and may have the same curvature or different curvatures within a process error range. For example, a curvature of each of the plurality of concave portions 181 may correspond to a curvature of a spherical shape having the second circle track CF2, and the curvature of the spherical shape having the second circle track CF2 may be calculated based on the first circle track CF1.

In each of the plurality of concave portions 181 according to an example embodiment of the present disclosure, when the pitch 'D' between two adjacent concave portions 181 is 4.2 µm to 4.8 µm, a curvature '1/R' of each of the plurality of concave portions 181 may have a range of 0.217 µm$^{-1}$ to 0.311 µm$^{-1}$ (0.217 µm$^{-1}$≤1/R≤0.311 µm$^{-1}$). For example, a curvature of each of the plurality of concave portions 181 may be calculated based on an equation of a sphere which passes through the center portion CP1 (or an origin point) of the first circle track CF1 and has the radius 'R', in an X-axis and Y-axis plane.

Figure 7:
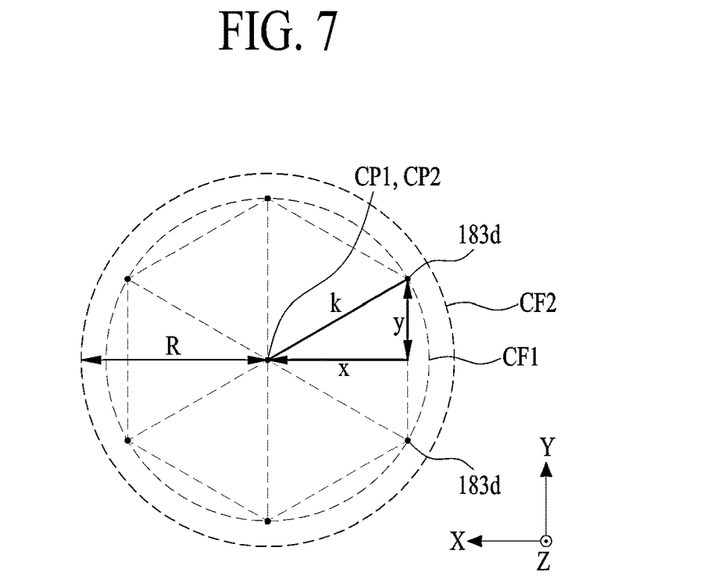
FIG. 7 is a plan view illustrating one concave portion and six peak portions illustrated in FIG. 4.

FIG. 7 is a plan view illustrating one concave portion and six peak portions illustrated in FIG. 4 and is a diagram for describing the calculation of a curvature of a concave portion according to an example embodiment of the present disclosure.

With reference to FIGS. 4 to 7, a curvature of each of the plurality of concave portions 181 may be calculated based on an equation of a sphere as in the following Equation.

$$x^2 + y^2 + (R - \alpha)^2 = R^2 \qquad \text{[Equation]}$$
$$2\alpha R = x^2 + y^2 + \alpha^2$$
$$R = \frac{x^2 + y^2 + \alpha^2}{2\alpha}$$
$$\text{Curvature} \, (1/R) = \frac{2\alpha}{x^2 + y^2 + \alpha^2}$$

In Equation, x may denote a half pitch "x=D/2" between two adjacent concave portions 181. For example, x may denote a distance between a center portion of the concave portion 181 and one side of a hexagon where each of the peak portions 183d near the concave portion 181 is a vertex, or may denote a distance between the center portion of the concave portion 181 and a straight line within a shortest distance between two adjacent peak portions 183d.

In the Equation, y may denote a half length of a length of one side of a hexagon where each of the peak portions 183d near the concave portion 181 is a vertex, or may denote a half distance of a shortest distance between two adjacent peak portions 183d. For example, according to a triangle equation, y may correspond to a height of a triangle, and thus, may denote a value 'x/√3' obtained by dividing x by square root 3. Also, R may denote a radius of a spherical shape corresponding to the concave portion 181.

In the Equation, a may denote a distance between the bottom surface 181a of the concave portion 181 and the center portion CP1 of the first circle track CF1 passing through the peak portions 183d near the concave portion

181. For example, α may denote an average height of six peak portions 183*d* disposed near the concave portion 181 from the bottom surface 181*a* of the concave portion 181.

In the Equation, each of x, y, and α may be calculated or measured from a planar structure and a cross-sectional structure of the light extraction pattern 180. Therefore, a radium 'It' of a spherical shape corresponding to the concave portion 181 may be calculated by substituting each of x, y, and α, calculated from the planar structure and the cross-sectional structure of the light extraction pattern 180, into Equation. Also, the curvature '1/R' of each concave portion 181 may be calculated by an inverse number '1/R' of the radium 'It' of the spherical shape corresponding to the concave portion 181.

Additionally, a distance 'k' between a center portion of the concave portion 181 and the peak portions 183*d* near the concave portion 181 or a radius 'k' of the first circle track CF1 passing through the peak portions 183*d* near the concave portion 181 may be a root value "$\sqrt{x^2+y^2}$" of "$x^2+y^2$". Accordingly, in Equation, a value of "$x^2+y^2$" may be replaced with the distance 'k' between the center portion of the concave portion 181 and the peak portions 183*d* near the concave portion 181.

According to an example embodiment of the present disclosure, in order to increase the light extraction efficiency of a pixel, a half pitch between two adjacent concave portions 181 may be set to a range of 2.1 μm to 2.4 μm, a half length 'y' of a length of one side of a hexagon where each of the peak portions 183*d* near the concave portion 181 is a vertex may be set to a range of 1.212 μm to 1.386 μm, an average height 'α' of six peak portions 183*d* disposed near the concave portion 181 from the bottom surface 181*a* of the concave portion 181 may be set to a range of 0.925 μm to 1.104 μm, and the curvature '1/R' of the concave portion 181 may be set to a range of 0.217 μm$^{-1}$ to 0.311 μm$^{-1}$.

Figure 8:
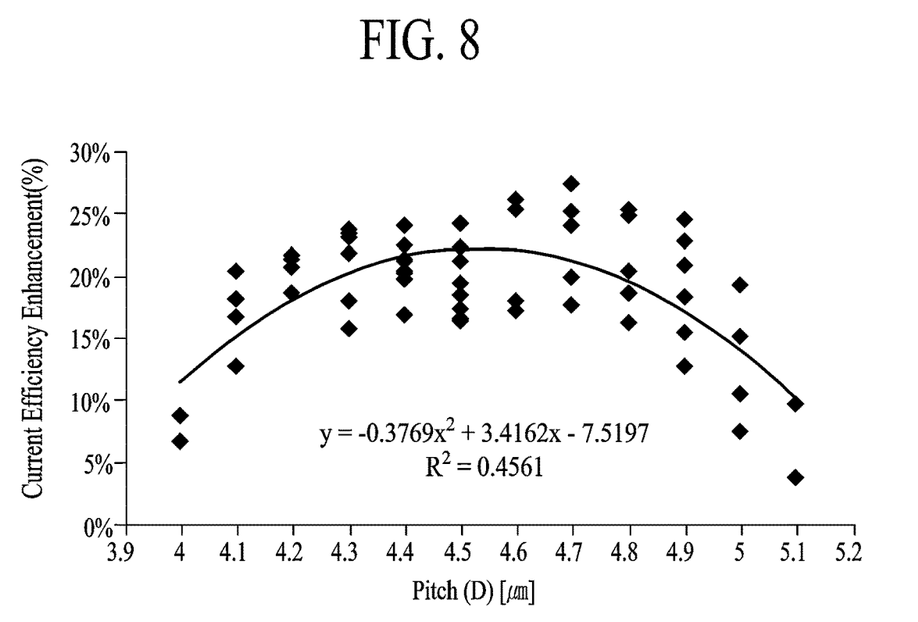
FIG. 8 is a graph illustrating a current efficiency increase rate of a pixel with respect to a pitch between two adjacent concave portions in a light emitting display apparatus according to an example embodiment of the present disclosure.

FIG. 8 is a graph illustrating a current efficiency increase rate of a pixel with respect to a pitch between two adjacent concave portions in a light emitting display apparatus according to an example embodiment of the present disclosure and illustrates a current efficiency increase rate of a pixel with respect to a current efficiency of a general pixel which does not include a light extraction pattern.

With reference to FIGS. 4 and 8, in the pixel of the light emitting display apparatus according to an example embodiment of the present disclosure, when a pitch 'D' between two adjacent concave portions 181 has a range of 4 μm to 5 μm (4 μm≤D≤5 μm), it may be seen that the current efficiency increase rate increases by about 5% or more compared to the general pixel. For example, in the pixel of the light emitting display apparatus according to an example embodiment of the present disclosure, when the pitch 'D' between the two adjacent concave portions 181 has a range of 4.1 μm to 4.9 μm (4.1 μm≤D≤4.9 μm), it may be seen that the current efficiency increase rate increases by about 10% or more compared to the general pixel. Also, in the pixel of the light emitting display apparatus according to an example embodiment of the present disclosure, when the pitch 'D' between the two adjacent concave portions 181 has a range of 4.2 μm to 4.8 μm (4.2 μm≤D≤4.8 μm), it may be seen that the current efficiency increase rate increases by about 15% or more as compared to the general pixel. According to a determination coefficient 'R2' based on a quadric equation where linear regression analysis is performed on the current efficiency increase rate of the pitch 'D' between the two adjacent concave portions 181, it may be seen that the current efficiency rate of increase of the pitch 'D' between the two adjacent concave portions 181 has a matching degree of about 45%.

Figure 9:
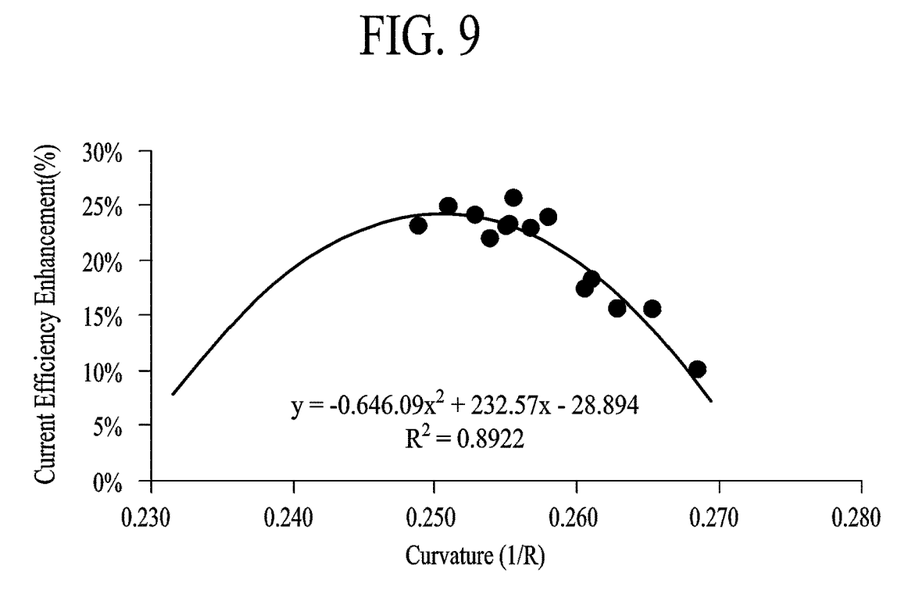
FIG. 9 is a graph illustrating a current efficiency increase rate of a pixel with respect to a curvature of a concave portion in a light emitting display apparatus according to an example embodiment of the present disclosure.

FIG. 9 is a graph illustrating a current efficiency increase rate of a pixel with respect to a curvature of a concave portion in a light emitting display apparatus according to an example embodiment of the present disclosure and illustrates a current efficiency increase rate of a pixel with respect to a current efficiency of a general pixel which does not include a light extraction pattern, when a half pitch between two adjacent concave portions 181 is 2.3 μm.

Referring to FIGS. 6 and 9, in the pixel of the light emitting display apparatus according to an example embodiment of the present disclosure, when a half pitch between two adjacent concave portions 181 is 2.3 μm and a curvature '1/R' of the concave portion 181 has a range of 0.230 μm$^{-1}$ to 0.270 μm$^{-1}$ (0.230 μm$^{-1}$≤1/R≤0.270 μm$^{-1}$), it may be seen that the current efficiency increase rate increases by about 10% or more compared to the general pixel. In the pixel of the light emitting display apparatus according to an example embodiment of the present disclosure, when the half pitch between the two adjacent concave portions 181 is 2.3 μm and the curvature '1/R' of the concave portion 181 has a range of 0.234 μm$^{-1}$ to 0.267 μm$^{-1}$ (0.234 μm$^{-1}$≤1/R≤0.267 μm$^{-1}$), it may be seen that the current efficiency increase rate increases by about 15% or more compared to the general pixel. According to a determination coefficient 'R2' based on a quadric equation where linear regression analysis is performed on the current efficiency increase rate of the curvature '1/R' of the concave portion 181, it may be seen that the current efficiency increase rate of the curvature '1/R' of the concave portion 181 has a matching degree of about 89%.

As another example, in the pixel of the light emitting display apparatus according to an example embodiment of the present disclosure, when a half pitch between two adjacent concave portions 181 is 2.1 μm and the curvature '1/R' of the concave portion 181 has a range of 0.275 μm$^{-1}$ to 0.311 μm$^{-1}$ (0.275 μm$^{-1}$≤1/R≤0.311 μm$^{-1}$), it may be seen that the current efficiency increase rate increases by about 10% or more compared to the general pixel.

As another example, in the pixel of the light emitting display apparatus according to an example embodiment of the present disclosure, when a half pitch between two adjacent concave portions 181 is 2.15 μm and the curvature '1/R' of the concave portion 181 has a range of 0.264 μm$^{-1}$ to 0.299 μm$^{-1}$ (0.264 μm$^{-1}$≤1/R≤0.299 μm$^{-1}$), it may be seen that the current efficiency increase rate increases by about 10% or more compared to the general pixel.

As another example, in the pixel of the light emitting display apparatus according to an example embodiment of the present disclosure, when the half pitch between two adjacent concave portions 181 is 2.2 μm and the curvature '1/R' of the concave portion 181 has a range of 0.253 μm$^{-1}$ to 0.288 μm$^{-1}$ (0.253 μm$^{-1}$≤1/R≤0.288 μm$^{-1}$), it may be seen that the current efficiency increase rate increases by about 10% or more compared to the general pixel.

As another example, in the pixel of the light emitting display apparatus according to an example embodiment of the present disclosure, when the half pitch between two adjacent concave portions 181 is 2.25 μm and the curvature '1/R' of the concave portion 181 has a range of 0.243 μm$^{-1}$ to 0.277 μm$^{-1}$ (0.243 μm$^{-1}$≤1/R≤0.277 μm$^{-1}$), it may be seen that the current efficiency increase rate increases by about 10% or more compared to the general pixel.

As another example, in the pixel of the light emitting display apparatus according to an embodiment of the present disclosure, when the half pitch between two adjacent concave portions 181 is 2.35 μm and the curvature '1/R' of the concave portion 181 has a range of 0.225 μm$^{-1}$ to 0.257 μm$^{-1}$ (0.225 μm$^{-1}$≤1/R≤0.257 μm$^{-1}$), it may be seen that the current efficiency increase rate increases by about 10% or more compared to the general pixel.

As another example, in the pixel of the light emitting display apparatus according to an embodiment of the present disclosure, when the half pitch between two adjacent concave portions 181 is 2.40 μm and the curvature '1/R' of the concave portion 181 has a range of 0.217 μm$^{-1}$ to 0.248 μm$^{-1}$ (0.217 μm$^{-1}$≤1/R≤0.248 μm$^{-1}$), it may be seen that the current efficiency increase rate increases by about 10% or more compared to the general pixel.

It may be seen that the curvature '1/R' of the concave portion 181 according to an example embodiment of the present disclosure sufficiently represents a light extraction efficiency of a light emitting display apparatus.

Therefore, in the light emitting display apparatus according to an example embodiment of the present disclosure, at least one of concave portions 181 of a light extraction pattern disposed in an opening portion of each pixel may have a curvature of 0.217 μm$^{-1}$ to 0.311 μm$^{-1}$, and thus, the emission efficiency, light extraction efficiency, and current efficiency increase rate of a pixel may be enhanced. Accordingly, the light extraction efficiency of light emitted from a light emitting portion of each pixel may be enhanced, thereby enhancing luminance and reducing power consumption.

The light emitting display device according to an example embodiment of the present disclosure can be applied to various applications. The light emitting display device according to an example embodiment of the present disclosure can be applied to mobile devices, video phones, smart watches, watch phones, wearable devices, foldable devices, rollable devices, bendable devices, flexible devices, curved devices, electronic organizers, electronic book, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc.

The light emitting display apparatus according to any one of these aspects may include one or more of the following features:

According to one aspect, a light emitting display apparatus comprises a substrate including a plurality of pixels, each of the pixels including an emission area; a light extraction pattern disposed in the emission area and having an undulated surface; and a light emitting portion disposed in the emission area on the light extraction pattern. The light extraction pattern may include a plurality of concave (or recessed) portions forming the undulated surface. The light extraction pattern may include a (e.g. one) protruding or convex portion surrounding each of the concave portions. At least one or each of the plurality of concave portions may have a curvature of 0.217 μm$^{-1}$ to 0.311 μm$^{-1}$.

According to another aspect, a light emitting display apparatus comprises a substrate including a plurality of pixels, each of the pixels including an emission area; a planarization layer disposed on the substrate and including a light extraction pattern in the emission area, the light extraction pattern having an undulated surface; and a light emitting portion disposed in the emission area, the light emitting portion including a first electrode disposed on the light extraction pattern, a light emitting device layer disposed on the first electrode, and a second electrode disposed on the light emitting device layer. The light extraction pattern may include a plurality of concave (or recessed) portions forming the undulated surface. The concave (or recessed) portions may be spaced apart from each other. The light extraction pattern may include a protruding or convex portion surrounding each of the concave portions. At least one or each of the plurality of concave portions may have a curvature of 0.217 μm$^{-1}$ to 0.311 μm$^{-1}$.

The light emitting display apparatus may be a bottom emission type or a top emission type or a bottom and top emission type. Each of the pixels may include an emission area. Each of the pixels may include further a circuit area surrounding said emission area.

The light extraction pattern may be formed in an upper surface of a planarization layer disposed on the substrate. That is, an upper surface of a planarization layer, i.e. the surface on which the light emitting portion is disposed, may have an undulated shape. The undulated surface or shape may also be denoted as uneven or corrugated or rippled or dimpled surface or shape.

The light emitting portion may be disposed on the light extraction pattern to have a corresponding undulated surface. That is, light emitting portion may have an upper and/or lower surface including a plurality of concave (or recessed) portions forming the undulated surface. The light emitting portion may include a protruding or convex portion surrounding each of the concave portions. The light emitting portion may be directly disposed on the light extraction pattern, i.e. may be disposed in contact with the light extraction pattern. The light emitting portion may include a first electrode, a light emitting device layer disposed on the first electrode and a second electrode disposed on the light emitting device layer. The light emitting portion may be configured to emit light.

In the present disclosure, the surface of the substrate (i.e. the substrate on which the light emitting portion is disposed) facing the light emitting portion may be denoted as upper surface of the substrate. A surface of a layer or element facing away from the substrate and/or facing the light emitting portion may be denoted as upper surface thereof. A surface of a layer or element facing the substrate and/or facing away from the light emitting portion may be denoted as lower surface. A thickness may refer to a dimension in direction perpendicular to a surface of the respective element or layer and/or to the substrate and/or to a surface, e.g. to light emitting surface, of the light emitting display apparatus. Likewise, a height may refer to a distance in direction perpendicular to the surface of the substrate and/or to a surface, e.g. to light emitting surface, of the light emitting display apparatus. A surface area may denote an area of a surface parallel to the surface of the substrate and/or to a surface, e.g. to light emitting surface, of the light emitting display apparatus.

In the present disclosure, the curvature may be defined as the reciprocal of the curvature radius. In particular, the curvature of a concave portion may be defined as the curvature of said concave portion at its center point.

A pitch or distance between center points (also denoted as center portions) of two adjacent concave portions may be 4.2 μm to 4.8 μm.

The light extraction pattern may further comprise a protruding portion surrounding each of the plurality of concave portions. The protruding portion may have a grid or honeycombed shape.

The light emitting portion may include a first electrode, a light emitting device layer and a second electrode. The first electrode may be disposed on the light extraction pattern.

The first electrode may be formed to be conformal with respect to a non-flat portion. The light emitting device layer may be formed to be non-conformal with respect to the first electrode. The first electrode and/or the second electrode may be formed to have a uniform thickness. The light emitting device layer may be formed to have a non-uniform or varying thickness.

A deepest point of the concave portions may correspond to a center point or center portion thereof. The center points of the concave portions may be located on a plane, in particular on a plane parallel to a surface of the substrate.

The light emitting display apparatus may further comprise a wavelength conversion layer disposed between the substrate and the light extraction pattern. The wavelength conversion layer may be disposed in the emission area. The wavelength conversion layer may be configured to change a wavelength of light passing therethrough. The wavelength conversion layer may include a color filter.

An arrangement region of the light extraction pattern may be wider than the emission area. That is, a surface area of the light extraction pattern may be larger than the emission area. The light extraction pattern may extend into the circuit area.

Each of the plurality of concave portions may be arranged in parallel to have a predetermined interval along a first direction. Each of the plurality of concave portions may be alternately arranged along a second direction crossing the first direction. The concave portions may be arranged in parallel along a plurality of lines extending in a first direction. Adjacent concave portions or center points of adjacent concave portions being arranged on one line may be spaced apart by a predetermined interval. One of or each of the plurality of concave portions may be surrounded by six other concave portions. The plurality of concave portions may be arranged in a hexagonal or triangular tiling in or of the emission area.

The protruding portion may include a plurality of peak portions provided between three adjacent concave portions, i.e. provided at a triangle center or centroid of the triangle formed by center points of three adjacent concave portions. The protruding portion may include a plurality of ridge portions formed between two adjacent concave portions. That is, a line connecting center points of two adjacent concave portions may cross, e.g. may perpendicularly cross, a ridge portion. The protruding portion may include a plurality of ridge portions connected between (or connecting) two adjacent peak portions, between two adjacent concave portions.

An average height between peak portions, disposed near one concave portion, of the plurality of peak portions and a bottom surface (or deepest point or center point) of the concave portion may be 0.925 μm to 1.104 μm. That is, a height of a peak portion, e.g. of each peak portion, with respect to a center point (or a bottom surface or a deepest point) of an adjacent concave portion may be within a range of 0.925 μm to 1.104 μm.

A distance between a center point or center portion of the concave portion and a straight line within a shortest distance between two adjacent peak portions of the plurality of peak portions may be 1.212 μm to 1.386 μm. A distance between a center point of one concave portion and a (straight) line connecting two peak portions may be 1.212 μm to 1.386 μm. Here, the two peak portions may be adjacent or closest to each other and may be adjacent or closest to said concave portion.

Six peak portions, disposed near one concave portion, of the plurality of peak portions and six ridge portions connected between the six peak portions have a hexagonal shape one-dimensionally. That is, six peak portions may be disposed to surround one concave portion in a hexagonal shape. Additionally or alternatively, six ridge portions may be connecting six peak portions adjacent to one concave portion in a hexagonal shape. Here, the hexagonal shape may be understood in a plane view, i.e. when viewed from top. Thus, the hexagonal shape may refer to the shape in a plane parallel to the substrate and/or to a light emitting surface of the light emitting display apparatus.

An origin point of a circle track passing through six peak portions, disposed near one concave portion, of the plurality of peak portions may be disposed under an origin point of a spherical shape corresponding to a curvature of the concave portion. The height of each of the peak portions may be less than a curvature radius of an adjacent concave portion.

Each of the plurality of ridge portions may be disposed between two adjacent concave portions and/or may be formed between the two adjacent peak portions in a concave curved shape, e.g. may be concave along a line connecting the two adjacent peak portions. Each of the ridge portions may connect two adjacent peak portions. Each of the ridge portions may have a curved, in particular a concave, shape. A line connecting two adjacent concave portions may cross a ridge portion, e.g. at a lowest point of the ridge portion, and/or at a center of the ridge portion, i.e. the line may cut the ridge portion located between said concave portions into half.

It will be apparent to those skilled in the art that various modifications and variations can be made in the light emitting display apparatus of the present disclosure without departing from the spirit or scope of the disclosure. Thus, it is intended that the present disclosure cover the modifications and variations of this disclosure provided they come within the scope of the appended claims and their equivalents.

What is claimed is:

1. A light emitting display apparatus, comprising:
  a substrate including a plurality of pixels each including an emission area;
  a light extraction pattern including a plurality of concave portions in the emission area; and
  a light emitting portion over the light extraction pattern,
  wherein at least one of the plurality of concave portions has a curvature of 0.217 μm−1 to 0.311 μm−1,
  wherein the light extraction pattern further comprises a plurality of protruding portions, each of the plurality of protruding portions is on respective adjacent sides of each of the plurality of concave portions,
  wherein the protruding portion comprises:
  a plurality of peak portions respectively provided between three adjacent concave portions; and
  a plurality of ridge portions connecting two adjacent peak portions and/or being provided between two adjacent concave portions, and
  wherein a height of each of the peak portions from a center point of an adjacent concave portion is less than a curvature radius at said center point of said adjacent concave portion.

2. The light emitting display apparatus of claim 1, wherein a pitch between center portions of two adjacent concave portions is 4.2 μm to 4.8 μm.

3. The light emitting display apparatus of claim 1, wherein the each of the plurality of protruding portions includes a convex curved shape.

4. The light emitting display apparatus of claim 1, wherein an arrangement region of the light extraction pattern is wider than the emission area.

5. The light emitting display apparatus of claim 1, wherein each of the plurality of concave portions are arranged in parallel to have a predetermined interval along a first direction, and are alternately arranged along a second direction crossing the first direction.

6. The light emitting display apparatus of claim 1, wherein a height of each of the peak portions from a center point of an adjacent concave portion is 0.925 μm to 1.104 μm, and/or
wherein a distance between a center point of one of the concave portions and a line connecting two adjacent peak portions is 1.212 μm to 1.386 μm.

7. A light emitting display apparatus, comprising:
a substrate including a plurality of pixels each including an emission area;
a planarization layer in the emission area including a light extraction pattern having a plurality of concave portions spaced apart from one another and a plurality of protruding portions, each of the plurality of protruding portions is on respective adjacent sides of each of the plurality of concave portions;
a first electrode over the light extraction pattern;
a light emitting device layer over the first electrode; and
a second electrode over the light emitting device layer,
wherein at least one of the plurality of concave portions has a curvature of 0.217 μm−1 to 0.311 μm−1,
wherein the plurality of protruding portions comprise:
a plurality of peak portions respectively provided between three adjacent concave portions; and
a plurality of ridge portions connecting two adjacent peak portions and/or being provided between two adjacent concave portions,
wherein a height of each of the peak portions from a center point of an adjacent concave portion is less than a curvature radius at said center point of said adjacent concave portion.

8. The light emitting display apparatus of claim 7, wherein the first electrode is formed to be conformal with respect to a non-flat portion of the light extraction pattern, and
wherein the light emitting device layer is formed to be non-conformal with respect to the first electrode.

9. The light emitting display apparatus of claim 7, further comprising a wavelength conversion layer between the substrate and the light extraction pattern.

10. The light emitting display apparatus of claim 7, wherein a pitch between center portions of two adjacent concave portions is 4.2 μm to 4.8 μm.

11. The light emitting display apparatus of claim 7, wherein an arrangement region of the light extraction pattern is wider than the emission area.

12. The light emitting display apparatus of claim 7, wherein each of the plurality of concave portions are arranged in parallel to have a predetermined interval along a first direction, and are alternately arranged along a second direction crossing the first direction.

13. The light emitting display apparatus of claim 7, wherein a height of each of the peak portions from a center point of an adjacent concave portion is 0.925 μm to 1.104 μm.

14. The light emitting display apparatus of claim 7, wherein a distance between a center point of one of the concave portions and a line connecting two adjacent peak portions is 1.212 μm to 1.386 μm.

15. The light emitting display apparatus of claim 7, wherein six ridge portions connecting six adjacent peak portions surround one concave portion in a hexagonal shape.

16. The light emitting display apparatus of claim 7, wherein a line connecting center points of two adjacent concave portions crosses a ridge portion and/or a lowest point of a ridge portion and/or a center of a ridge portion.

* * * * *